United States Patent
Hong et al.

(10) Patent No.: US 7,161,442 B2
(45) Date of Patent: Jan. 9, 2007

(54) LATCH SYSTEM COMPRISING AN ACTION MODULE TO INCREASE NEGATIVE RESISTANCE

(75) Inventors: Chia-Ming Hong, Chang-Hua Hsien (TW); Wei-Shan Wang, Tai-Chung Hsien (TW); Yung-Sheng Huang, Taipei (TW)

(73) Assignee: United Microelectronics Corp., Hsin-Chu ( * ) Notice: Subject to any disclaimer, the term of this patent is extended or adjusted under 35 U.S.C. 154(b) by 0 days.

(21) Appl. No.: 10/248,279

(22) Filed: Jan. 6, 2003

(65) Prior Publication Data

US 2004/0130369 A1 Jul. 8, 2004

(51) Int. Cl.
*H03K 7/06* (2006.01)
(52) U.S. Cl. ............... 331/113 R; 331/117 R; 331/116 FE; 331/117 FE
(58) Field of Classification Search ............... 327/199, 327/203, 204, 206, 207, 208, 210, 215, 222, 327/568; 331/117 R, 177 V
See application file for complete search history.

(56) References Cited

U.S. PATENT DOCUMENTS

| | | | | |
|---|---|---|---|---|
| 5,243,236 A | * | 9/1993 | McDaniel | 326/68 |
| 5,338,987 A | * | 8/1994 | Tomasetti et al. | 327/108 |
| 5,477,497 A | * | 12/1995 | Park et al. | 365/205 |
| 5,561,621 A | * | 10/1996 | Devin et al. | 365/49 |
| 5,710,739 A | * | 1/1998 | Calligaro et al. | 365/205 |
| 5,912,587 A | * | 6/1999 | Mihailovits et al. | 330/252 |
| 6,208,554 B1 | * | 3/2001 | Phan et al. | 365/154 |
| 6,249,192 B1 | * | 6/2001 | Gabara et al. | 331/117 R |
| 6,259,643 B1 | * | 7/2001 | Li | 365/206 |
| 6,621,331 B1 | * | 9/2003 | Pobanz et al. | 327/568 |
| 6,650,195 B1 | * | 11/2003 | Brunn et al. | 331/177 V |
| 6,684,065 B1 | * | 1/2004 | Bult et al. | 455/252.1 |
| 6,724,244 B1 | * | 4/2004 | Wu | 327/543 |
| 6,765,377 B1 | * | 7/2004 | Lu | 324/123 R |
| 6,765,448 B1 | * | 7/2004 | Wu et al. | 331/117 FE |
| 6,784,734 B1 | * | 8/2004 | Amourah | 330/253 |
| 6,784,753 B1 | * | 8/2004 | Leenaerts et al. | 331/36 C |
| 6,850,122 B1 | * | 2/2005 | Ravi et al. | 331/46 |
| 6,867,658 B1 | * | 3/2005 | Sibrai et al. | 331/185 |
| 6,885,245 B1 | * | 4/2005 | Liu | 330/253 |
| 6,972,635 B1 | * | 12/2005 | McCorquodale et al. | 331/167 |
| 2003/0174024 A1 | * | 9/2003 | Sandner | 331/36 C |
| 2005/0040898 A1 | * | 2/2005 | Garvin | 331/34 |
| 2005/0180224 A1 | * | 8/2005 | Tzartzanis et al. | 365/189.09 |
| 2005/0219932 A1 | * | 10/2005 | Diorio et al. | 365/225.7 |

* cited by examiner

*Primary Examiner*—Tuan T. Lam
*Assistant Examiner*—Hiep Nguyen
(74) *Attorney, Agent, or Firm*—Winston Hsu

(57) ABSTRACT

A latch system used for providing a negative resistance. It includes a current source module used for providing at least one DC current. The latch system also includes a first cross-coupling module, which contains a first inverter, a second inverter, and an action module. The action module contains at least one action block, each of which contains a first device and a second device. The action module is electrically connected to the first and second inverter and is used for increasing the negative resistance of the latch system.

12 Claims, 16 Drawing Sheets

LATCH SYSTEM COMPRISING AN ACTION MODULE TO INCREASE NEGATIVE RESISTANCE

BACKGROUND OF INVENTION

1. Field of the Invention

The invention relates to a latch system, and more particularly, to a latch system comprising an action module for increasing the negative resistance of the latch system.

2. Description of the Prior Art

Among electronic circuit design for communications and other varieties of applications, voltage-controlled oscillators (VCO) have always been one of the most important circuit building blocks. Usually, a phase lock loop (PLL) is used in a VCO for generating a clock signal with fixed phase, and the clock signal could then be used for transforming high frequency signals into low frequency signals in communications applications. In other words, the PLL is used as a local oscillator (LO). In general, there are two mainstream design methodologies for VCOs in conventional complementary metal-oxide semiconductor (CMOS) fabrication technologies: one is to use only standard CMOS fabrication technologies, for example relaxation oscillators and ring oscillators; the other one is to use LC tank structure in an oscillator circuit. The later one tends to increase the degree of complexity in a manufacturing process for its utilization of integrated inductors in CMOS fabrication technologies, but since it has a relatively much simpler circuit structure at the same time it will generate clock signals with much higher quality (for example more independence from variations in supply voltages and temperature, as well as higher immunity against noise). Therefore, VCOs with LC tank structure are still favorable for most of the circuit designers.

Please refer to FIG. 1 that shows a block diagram of a prior art LC tank VCO 10. The VCO 10 comprises a current source module 24, which is used for providing a DC current; a cross-coupled pair 12, which is usually formed by two exactly identical MOSFETs 14 and 16. A drain of the MOSFET 14 is electrically connected to a gate of the MOSFET 16, while a drain of the MOSFET 16 is electrically connected to a gate of the MOSFET 14, and signals are taken out from the two gates (which are also the drains in this example) as two output nodes of the VCO 10. A resistance $R_N$ shown in FIG. 1 represents the equivalent resistance of the cross-coupled pair 12. The VCO 10 also comprises a LC tank 18, which includes a capacitance 20 and an inductance 22, and is electrically connected between the two output nodes of the VCO 10. A resistance $R_P$ represents the equivalent resistance of all the elements in the LC tank 18. From the circuit structure mentioned above, the VCO 10 will be able to start with a tiny noise signal existing in it, without any help from external initial signals, through the oscillation of the cross-coupled pair 12 accompanied with the capacitance 20 and the inductance 22 with respect to the tiny noise signal, to generate two oscillating signals with 180° phase difference at the two output nodes, while the oscillating frequency of the signals is related to the natural frequency of the LC tank 18. Please note, in FIG. 1 the capacitance 20 of the LC tank 18 represents the equivalent capacitance of the LC tank 18, and the inductance 22 represents the equivalent inductance of the LC tank 18. Usually the LC tank 18 of the VCO 10 will have a voltage-controlled mechanism in order to control the oscillating frequency of the VCO 10, but for simplification, the voltage-controlled mechanism is not shown in FIG. 1.

For the VCO 10 to enter oscillation successfully, it must meet ascertain criterion, which is that the sum-up equivalent resistance has to be a negative value, because only a circuit structure with a negative equivalent resistance will have the ability to enlarge a tiny signal. For the VCO 10 in FIG. 1, its sum-up equivalent resistance could be seen as the add-up of the equivalent resistance of the LC tank 18, $R_P$, and the equivalent resistance of the cross-coupled pair 12, $R_N$. Usually, the equivalent resistance of the LC tank 18 $R_P$ is a positive value. This means, if the VCO 10 would like to enter oscillation successfully, the absolute value of the equivalent resistance of the cross-coupled pair 12 $R_N$ must be larger than the resistance $R_P$. Assume that the transconductances of the MOSFET 14 and 16 are both $g_m$, the equivalent resistance of the cross-coupled pair 12 $R_N$ will be a negative value ($-2/g_m$). This is exactly the reason why the VCO 10 could enter oscillation.

However, because of the applications such as a wireless local area network (WLAN), the frequencies of oscillating signals in present day circuit designs tend to have very high values (for example 5.2 GHz or above). Also, in order to control the cost of manufacturing, the quality factor Q of the inductance 22 is hard to improve. These factors cause the absolute value of the equivalent resistance $R_N$ to be larger than the value of the equivalent resistance $R_P$ an extremely difficult goal to achieve, and as a result, the VCO 10 is very hard to enter self-resonance. The VCO technologies according to prior art usually will obtain a larger absolute value of the equivalent resistance by raising the DC current of the current source module 24 used as the bias current of the VCO 10 in order to lower the transconductances of the MOSFETs 14, 16. However, if this is the case, the power consumption of the VCO 10 will not be able to be constrained, and thus it is not suitable for the low power dissipation requirement of the present day communications circuit design.

SUMMARY OF INVENTION

It is therefore a primary objective of the claimed invention to provide a latch system comprising an action module, which could present a negative resistance with a much larger absolute value to a LC tank VCO, to solve the above-mentioned problem.

According to the claimed invention, a latch system comprises a current source module for providing at least one DC current. The latch system also comprises a first cross-coupling module. The first cross-coupling module comprises a first inverter for outputting a low-level voltage at an output node when a high-level voltage is inputted at an input node, and for outputting a high-level voltage at the output node when a low-level voltage is inputted at the input node. The first cross-coupling module also comprises a second inverter for outputting a low-level voltage at an output node when a high-level voltage is inputted at an input node, and for outputting a high-level voltage at the output node when a low-level voltage is inputted at the input node. The first cross-coupling module further comprises an action module electrically connected to the first and the second inverter wherein the action module comprises at least one action block, and each action block comprises a first device and a second device and is used for increasing the negative resistance of the latch system.

It is an advantage of the claimed invention that the latch system provides a negative resistance with a much larger absolute value by including the action module. Therefore, the latch system can be used as the negative resistance generator and make a LC tank VCO enter self-resonance more easily.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
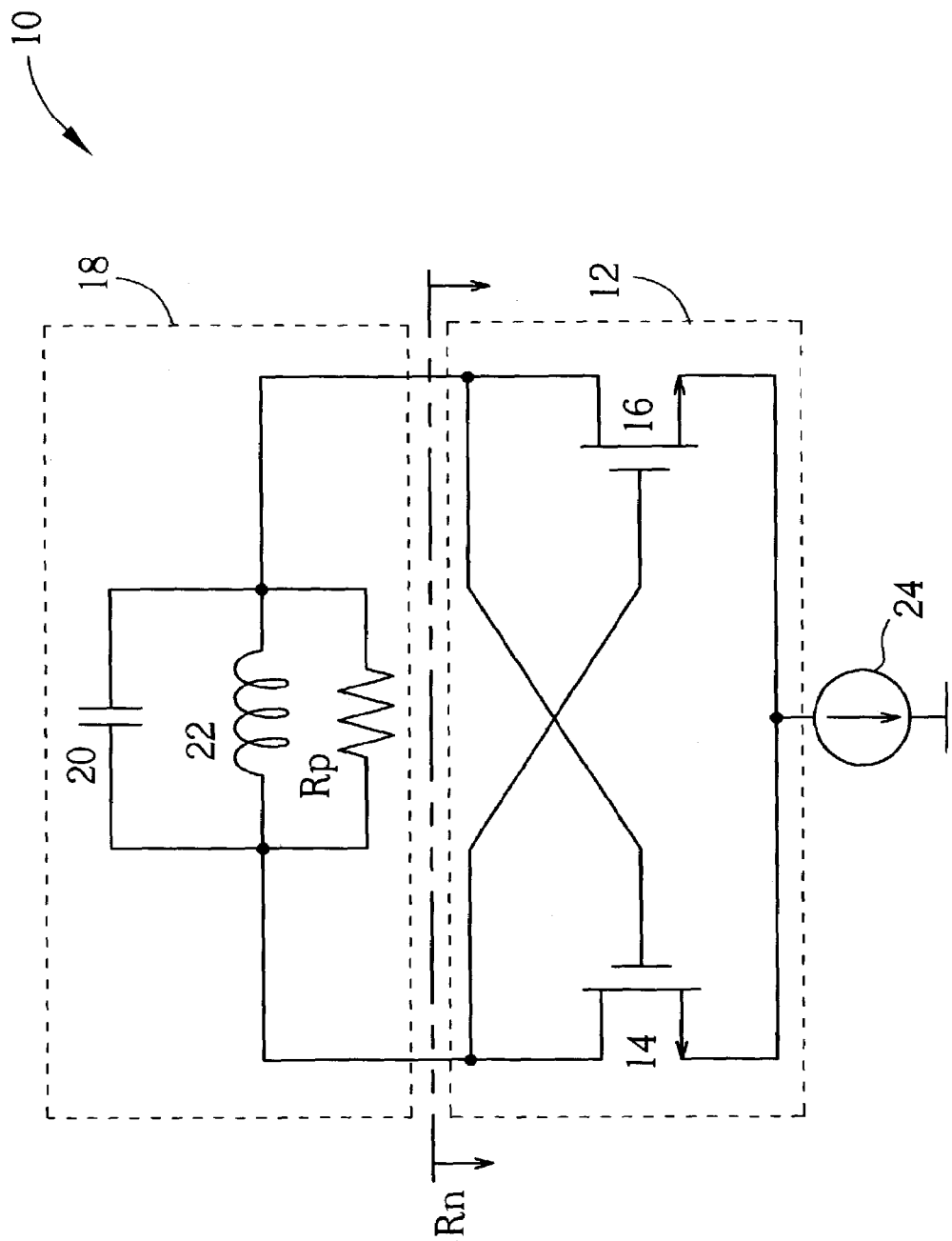
FIG. 1 is a block diagram of a LC tank voltage-controlled oscillator according to prior art.
Figure 2A:
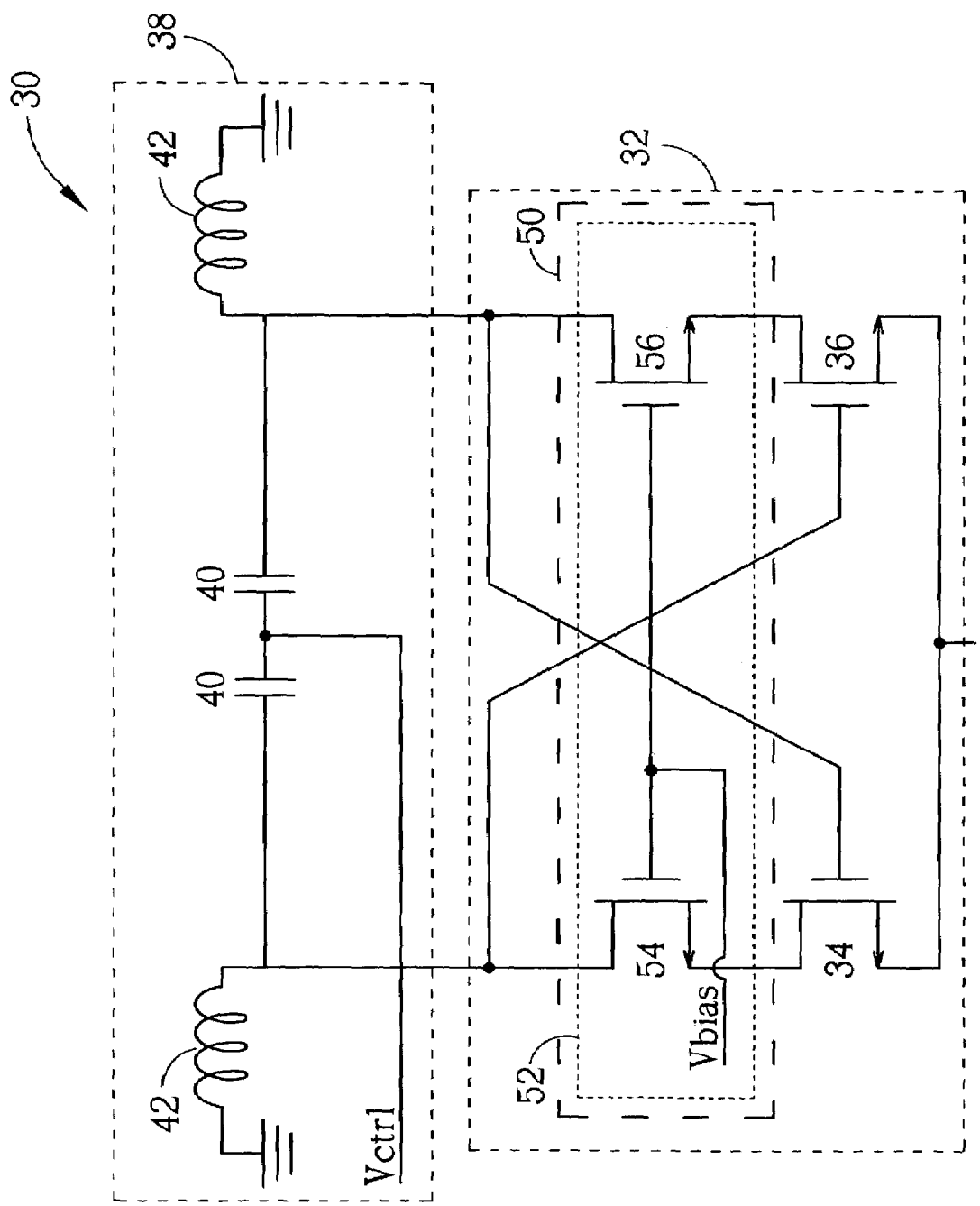
FIGS. 2A and 2B are block diagrams of a LC tank voltage-controlled oscillator using a latch system according to present invention.
Figure 2B:
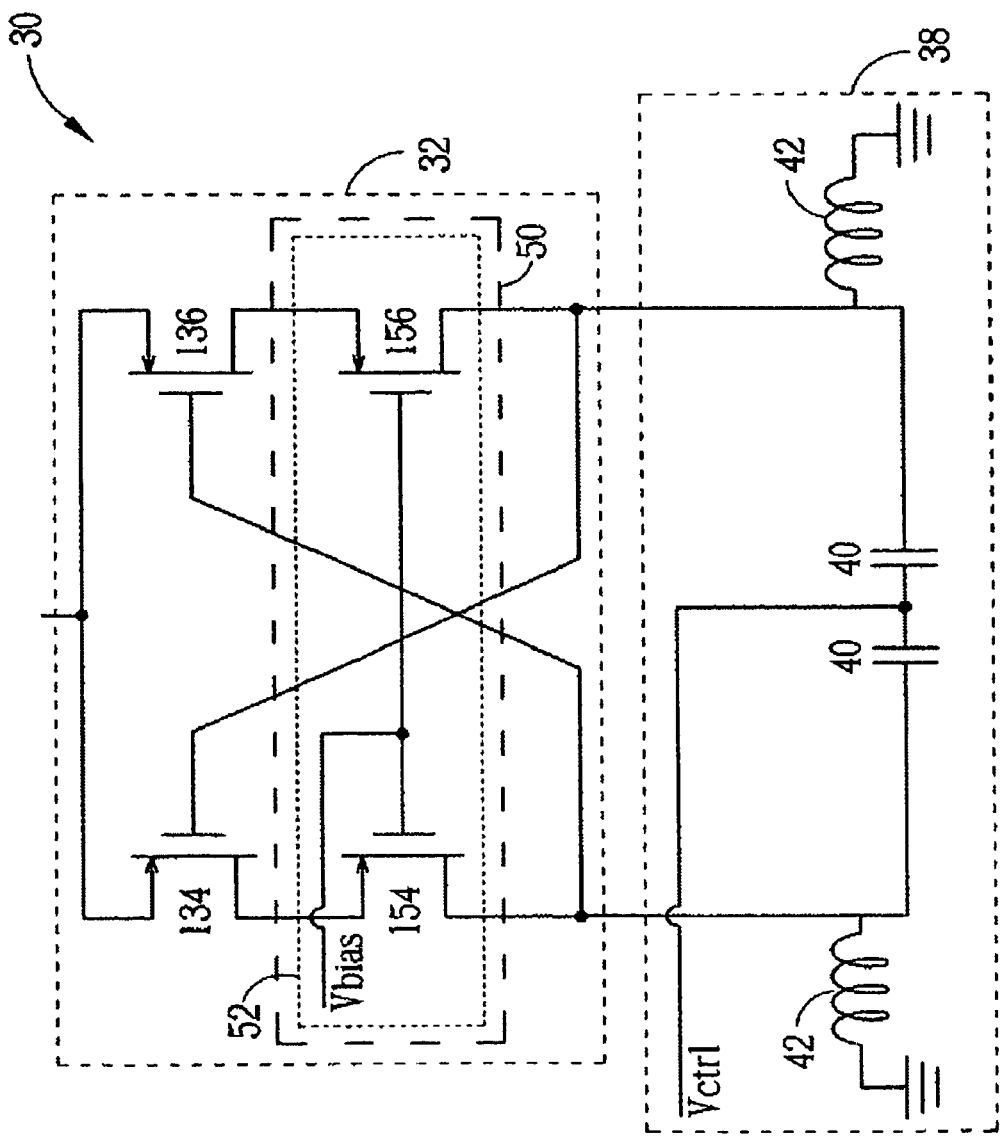

Please refer to FIGS. 2A and 2B. FIGS. 2A and 2B show a LC tank VCO 30 using a latch system 32 according to present invention, wherein the latch system 32 of FIG. 2A utilizes N-type MOSFET technology, while that of FIG. 2B utilizes P-type MOSFET technology. Since the difference between FIGS. 2A and 2B lies only in the type of devices while the circuit configurations are totally identical, the following description will focus on the LC tank VCO 30 using the latch system 32 according to present invention in FIG. 2A, and its complementary configuration in FIG. 2B can be analyzed following similar reasoning. The VCO 30 in FIG. 2A comprises the latch system 32 according to present invention and a LC tank 38, wherein the latch system 32 has a current source module (not shown in FIG. 2A) to provide at least one DC current. The latch system 32 also has a first cross-coupling module, wherein the first cross-coupling module comprises a first inverter 34 and a second inverter 36. The two inverters 34, 36 are used for outputting a low-level voltage at an output node when a high-level voltage is inputted at an input node, and for outputting a high-level voltage at the output node when a low-level voltage is inputted at the input node. The first cross-coupling module also has an action module 50, which is electrically connected to the first and the second inverter 34, 36. The action module 50 comprises an action block 52, wherein the action block 52 has a first device 54 and a second device 56 and is used for increasing the negative resistance of the latch system 32. The LC tank 38 comprises at least one capacitor 40, at least one inductor 42, and a control voltage Vctrl, wherein the control voltage Vctrl is used for controlling the oscillating frequency of the VCO 30. Since the connection and function of the LC tank 38 is the same as that of the prior art, the detailed description will not be repeated here.

Figure 3A:
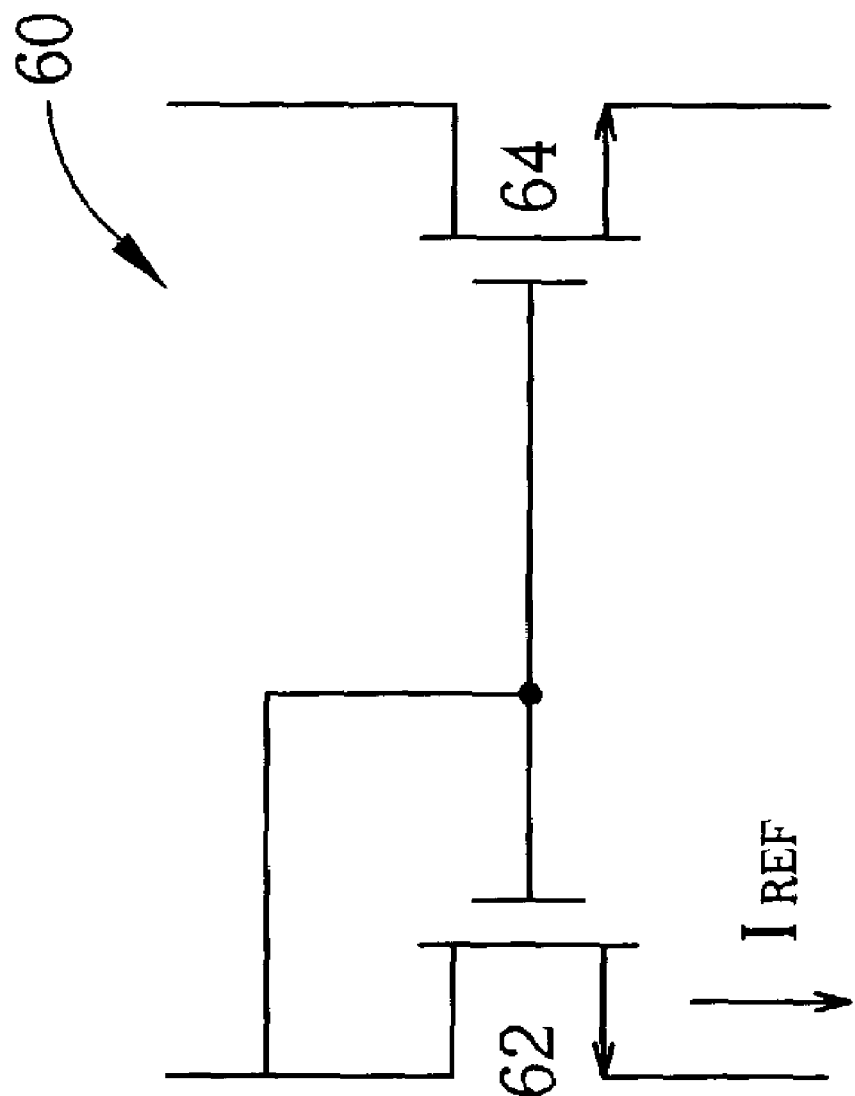
FIGS. 3A and 3B are block diagrams of a current mirror configuration used as the current source module of a latch system according to present invention.
Figure 3B:
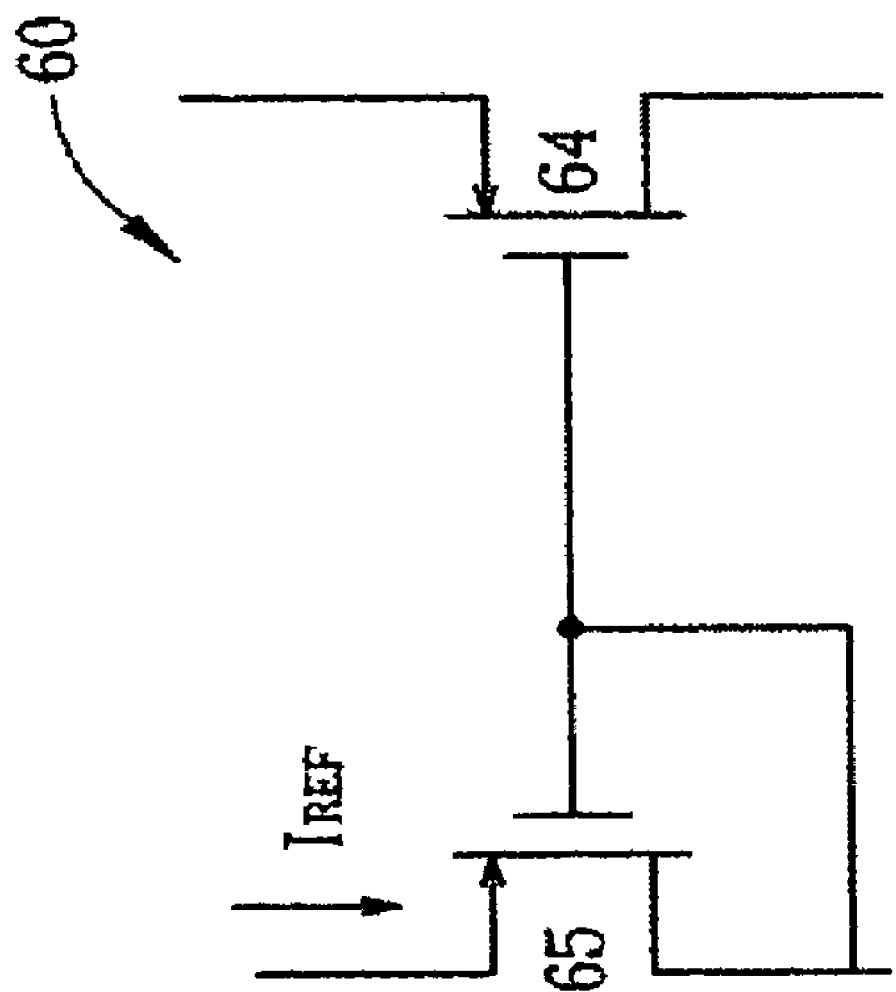

Now please refer to FIGS. 2A, 3A, and 3B. In FIG. 2A it shows a preferred embodiment of the latch system 32 according to present invention, wherein the first and the second inverter 34, 36 are two common source configurations of N-type MOSFETs. The input nodes of the first and the second inverter 34, 36 are the gazes of the MOSFETs, while the output nodes of the first and second inverter 34, 36 are the drains of the MOSFETs, and the two output nodes of the VCO 30 are taken out from the signals at the gates of the first and the second inverter 34, 36. The first and the second devices 54, 56 of the action block 52 in the action module 50 are N-type MOSFETs, wherein the source of the first device 54 is electrically connected to the output node of the first inverter 34, while the source of the second device 56 is electrically connected to the output node of the second inverter 36. The drain of the first device 54 is electrically connected to the input, node of the second inverter 36, while the drain of the second device 56 is electrically connected to the input node of the first inverter 34. The gates of the first and the second devices 54, 56 are commonly electrically connected to a reference voltage Vbias, which provides the operating bias voltage of the first and the second devices 54, 56. In FIG. 2B first and second invertors 134, 136 and firstand second devices 154, 156 are PMOSFET technology components that respectively correspond with the first and second inverters 34, 36 and the first and second devices 54, 56 of FIG. 2A.

FIGS. 3A and 3B show a current source module 60 with current mirror configuration, wherein that of FIG. 3A utilizes NMOSFET technology, and that of FIG. 3B utilizes PMQSFET technology. The current module 60 comprises a MOSFET 62 with its gate and drain connected together. The gate of the MOSFET 62 is electrically connected to at least one MOSFET 64 of the same type, and will mirror a reference current href flowing through the channel of the MOSFET 62 onto the channel current of the MOSFET 64 to achieve the purpose of providing a DC current to the MOSFET 64. The current source module of the latch system 32 in FIG. 2A could be the current source module 60 in FIG. 3A, and it can be electrically connected to the sources of the first and the second inverters 34, 36. Or the gate of the MOSFET 62 can be directly connected to the gates of the first and the second devices 54, 56, wherein the first and the second devices 54, 56 can be used instead of the MOSFET 64 to provide the DC bias current needed by the latch system 32. In FIG. 3B, PMOSFETs 65, 64 respectively correspond with the NMOSFETs 62, 63 of FIG. 3A.

The latch system 32 according to present invention is to add the action module 50 to the cross-coupled pair 12 in the prior art. The function of the action module 50 is to enormously lower the total transconductance of the latch system 32 during the oscillation start-up period of the VCO 30, such that the latch system 32 could provide a negative resistance with a fairly large absolute value to let the VCO 30 enter self-resonance more easily with little variation in resonance frequency. Meanwhile, because the action module 50 can be treated as a variable resistor when entering self-resonance and its resistance will change according to the amplitude of the oscillating signals at the two output nodes of the VCO 30, the amplitude of the oscillating signals will not be attenuated too much due to the existence of the action module 50.

Figure 4A:
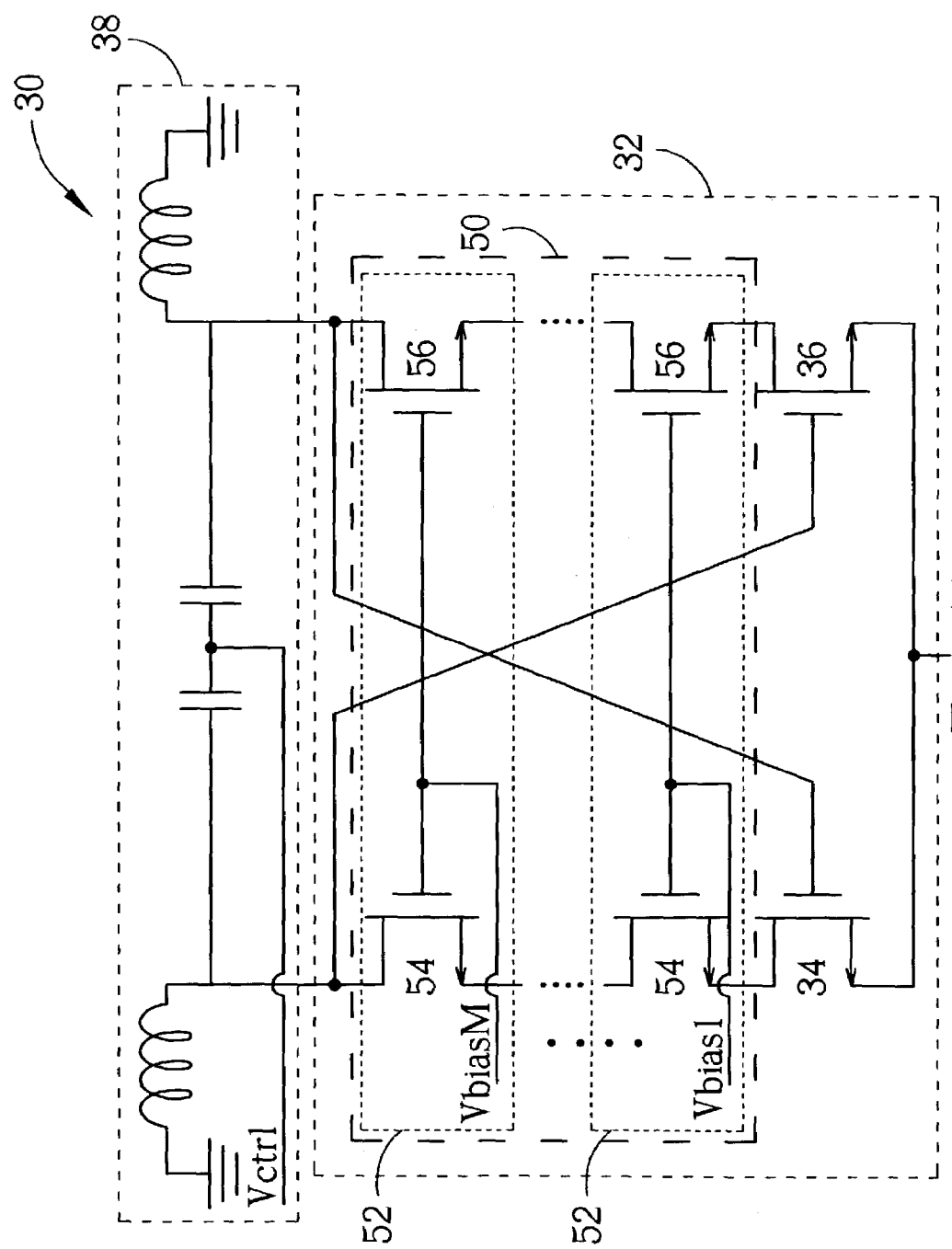
FIGS. 4A and 4B are block diagrams of a LC tank voltage-controlled oscillator using a latch system with a plurality of action blocks according to present invention.
Figure 4B:
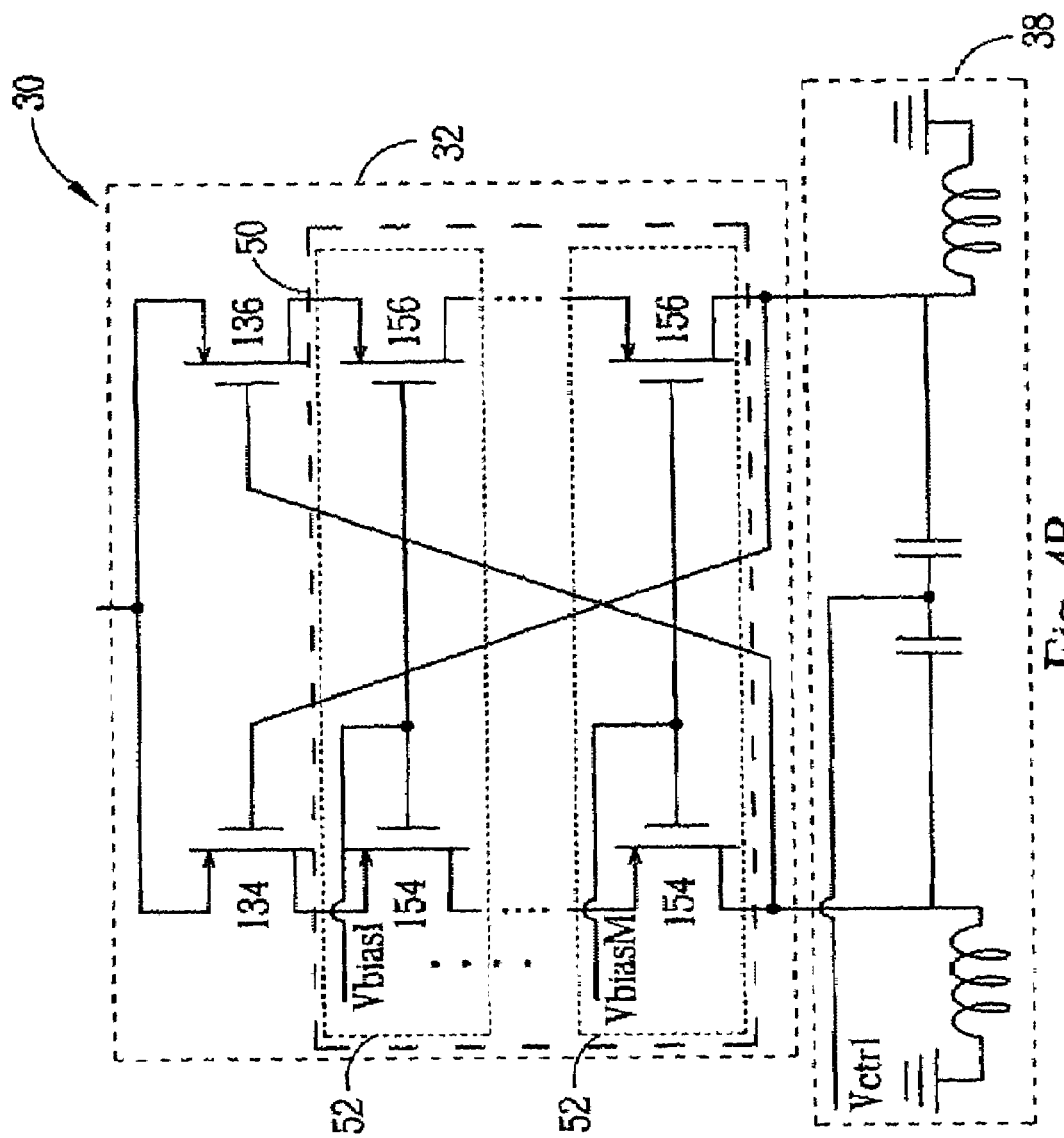
Figure 5A:
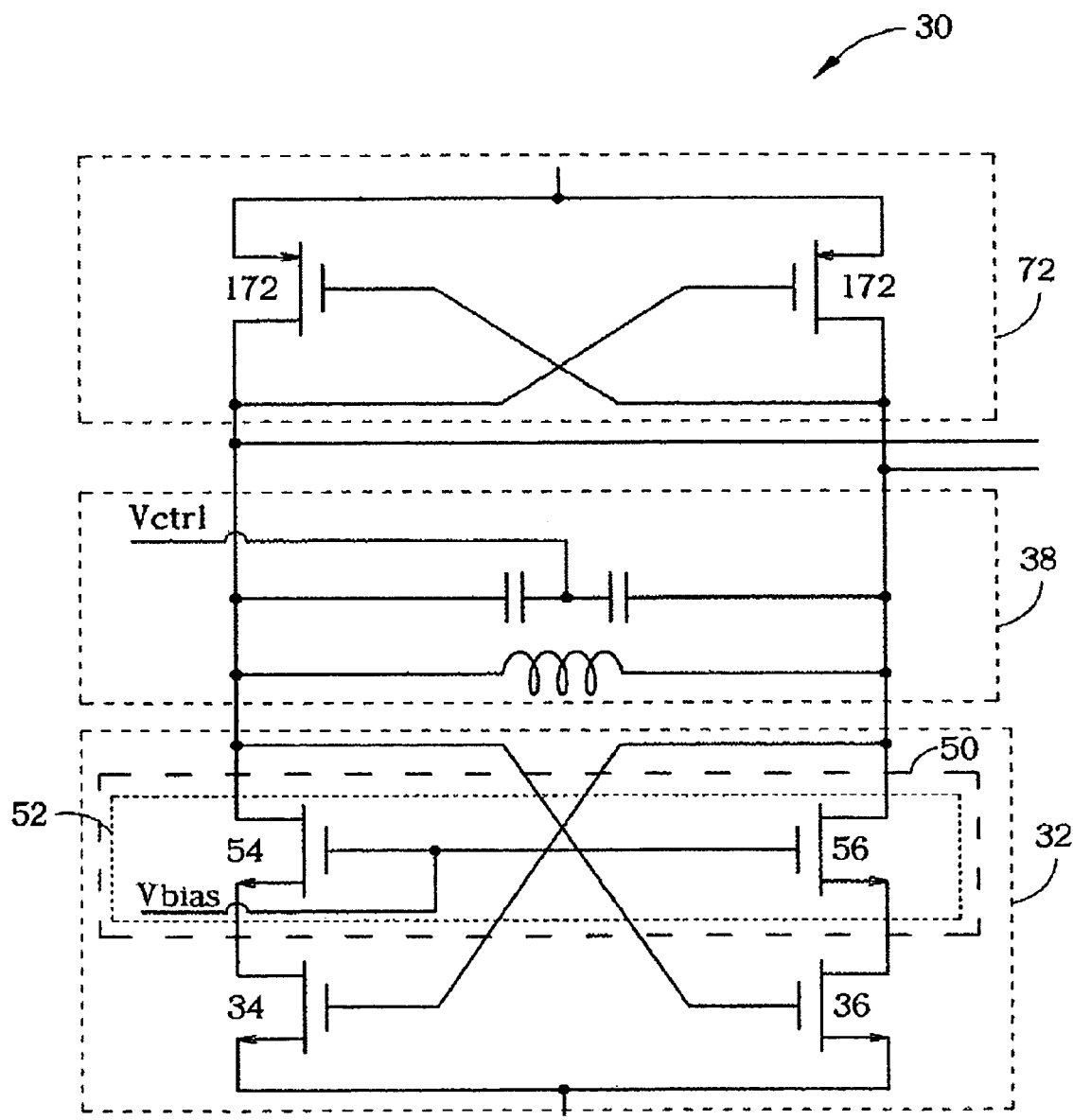
FIGS. 5A and 5B are block diagrams of a LC tank voltage-controlled oscillator using a latch system with a cross-coupled pair according to present invention.
Figure 5B:
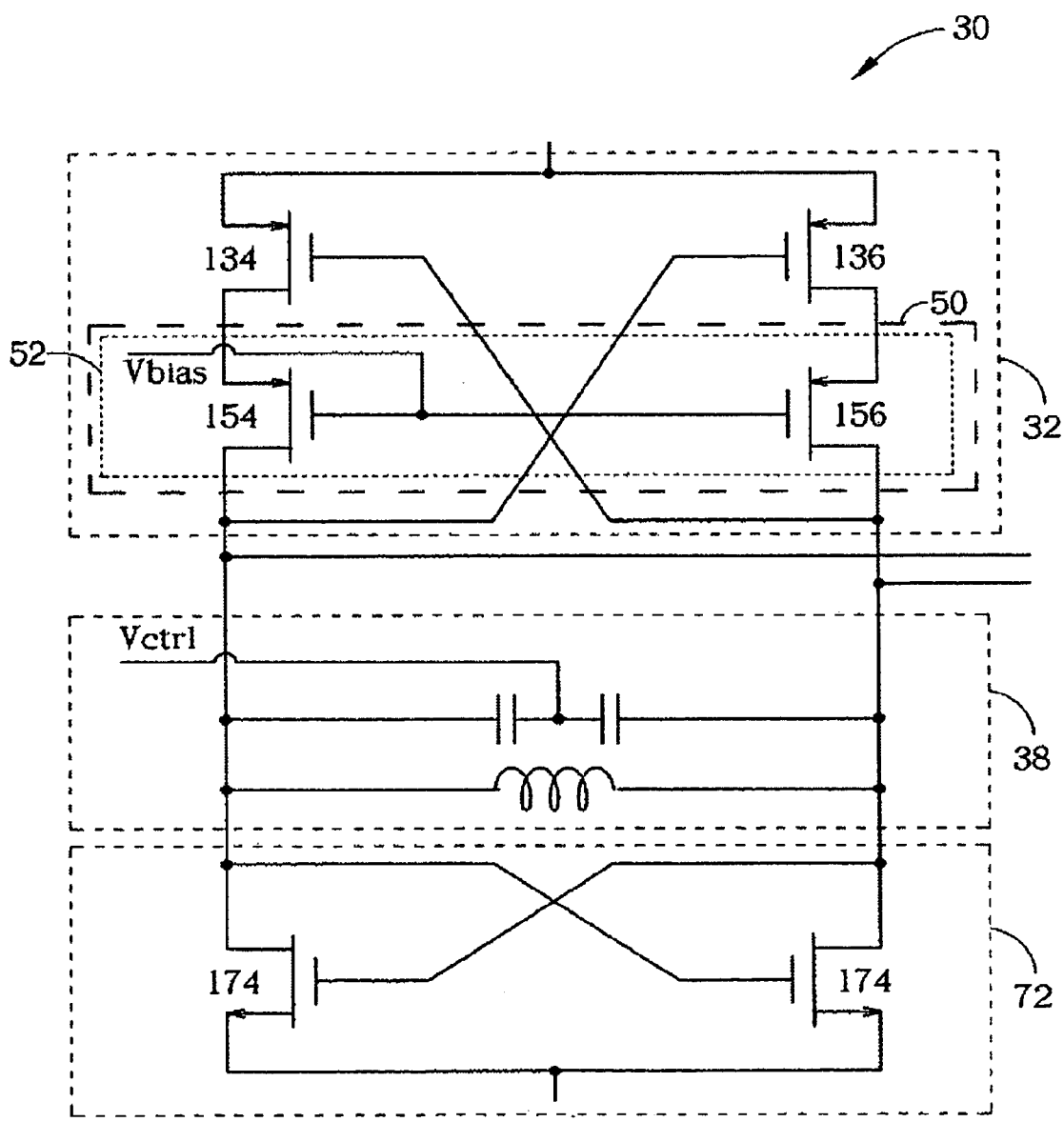

Please refer to FIGS. 4A and 4B. FIGS. 4A and 4B show another embodiment of the latch system 32 according to present invention. The circuit configurations in FIGS. 4A and 4B are quite similar to the VCO 30 in FIGS. 2A and 2B and will not again be described in detail. However, the action module 50 in FIGS. 4A and 4B comprises a plurality of action blocks 52, wherein each action block 52 consists of a first device 54 and a second device 56 (154, 156 in FIG. 4B). The action blocks 52 are electrically connected to one another through cascading and are used for increasing the negative resistance of the latch system 32. The first and the second devices 54, 56 can be MOSFETs similar to those in FIGS. 2A and 2B, and the gates of the first and the second devices 54, 56 can also be connected to a reference voltage similar to those in FIGS. 2A and 2B. All of the action blocks 52 can have a single reference voltage value, or they can have different values such as Vbias1, Vbias2 . . . VbiasM as shown in FIGS. 4A and 4B. This is a design choice of the circuit designers. While the current source module of the latch system 32 can be connected to the sources of the first and the second inverters 34, 36 (134, 136 in FIG. 4B) as mentioned above, or the gate of the MOSFET 62 in FIGS. 3A and 3B can be directly connected to the gates of the first and the second devices 54, 56 in one of the action blocks 52, wherein the first and the second devices 54, 56 can be used instead of the MOSFET 64 to provide the DC bias current needed by the latch system 32, Please refer to FIGS. 5A and 5B. FIGS. 5A and 5B show another embodiment of the latch system 32 according to present invention. The circuit configurations in FIGS. 5A and 5B are quite similar to the VCO 30 in FIGS. 2A, and 2B and will not again be described in detail. However, the latch system 32 in FIGS. 5A and 5B further comprises a cross-coupled pair 72. Take FIG. 5A for example, the cross-coupled pair 72 consists of two PMOSFETs 172 and is electrically connected to the input nodes of the first and the second inverter 34, 36. In FIG. 5B, the cross-coupled pair 72 consists of two NMOSFETs 174 and is electrically connected to the input nodes of the first and second inverter 134, 136. The cross-coupled pair 72 acts as the complementary circuitry of the first cross-coupling module in the latch system 32. The VCO 30 in FIG. 5B then could be analyzed following similar reasoning.

Figure 6A:
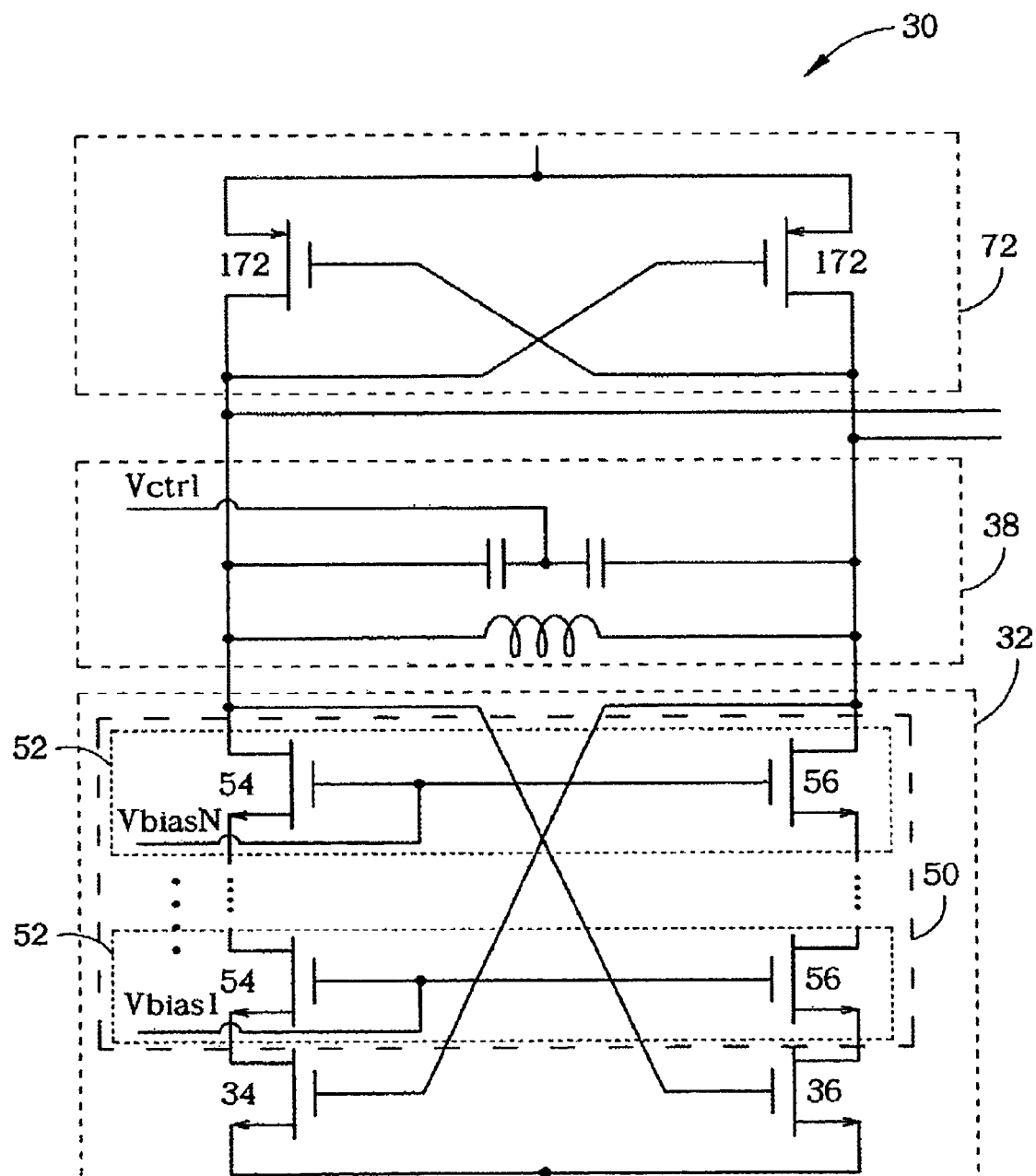
FIGS. 6A and 6B are block diagrams of a LC tank voltage-controlled oscillator using a latch system with a plurality of action blocks and a cross-coupled pair according to present invention.
Figure 6B:
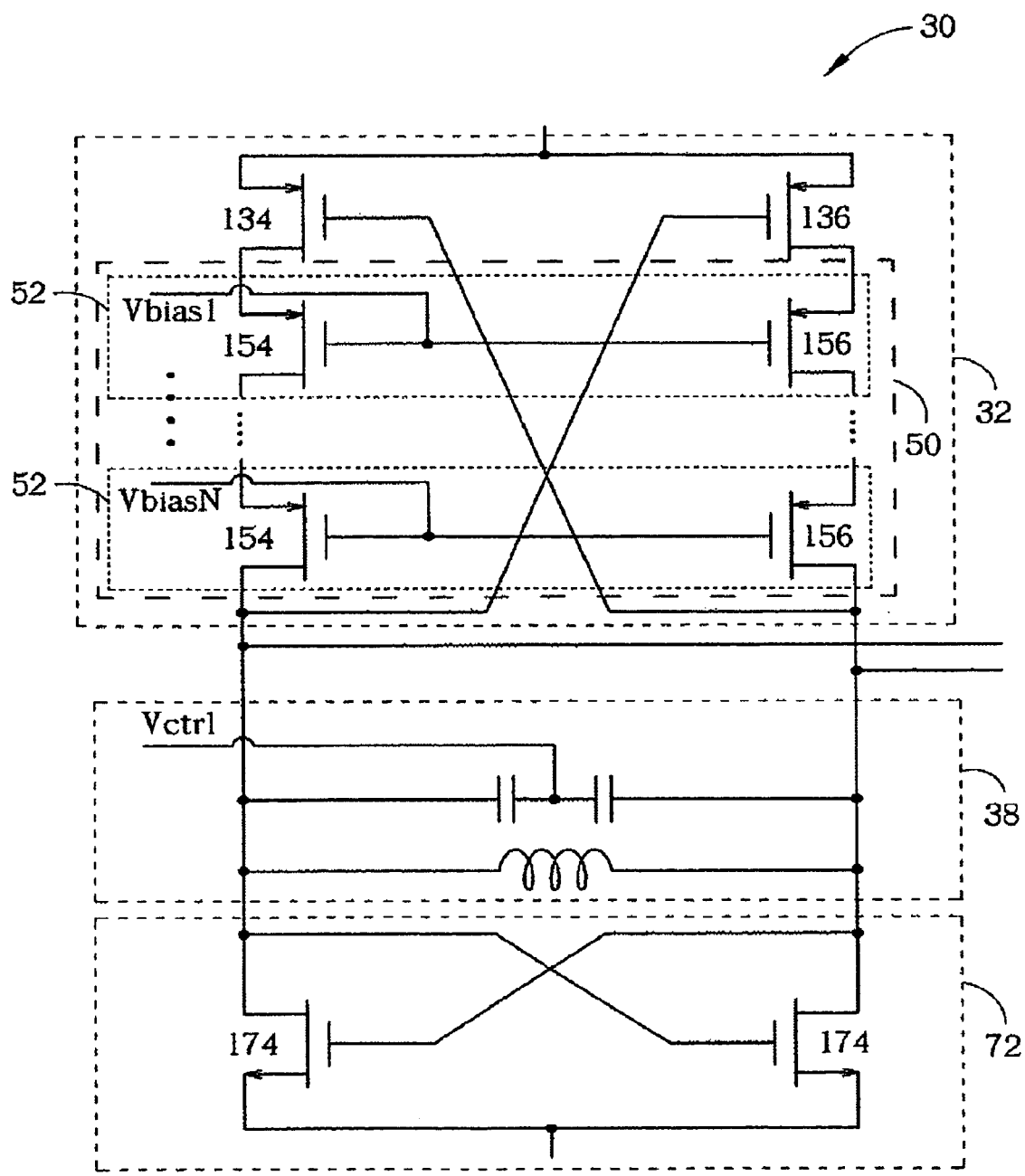

Please refer to FIGS. 6A and 6B. FIGS. 6A and 6B show another embodiment of the latch system 32 according to present invention. The circuit configurations in FIGS. 6A and 6B are quite similar to the VCO 30 in FIGS. 5A and 5B and will not again be described in detail. But the action module 50 in FIGS. 6A and 6B has similar feature (i.e. a plurality of action blocks 52) as that in FIGS. 4A and 4B, wherein the gates of the first and the second devices 54, 56 in each action block 52 can be commonly connected to a reference voltage similar to those in FIG. 2A and FIG. 2B. All of the action blocks 52 can have a single reference voltage value, or they can have different values such as Vbias1, Vbias2 . . . VbiasM as shown in FIGS. 6A and 6B. This is a design choice of the circuit designers.

Figure 7A:
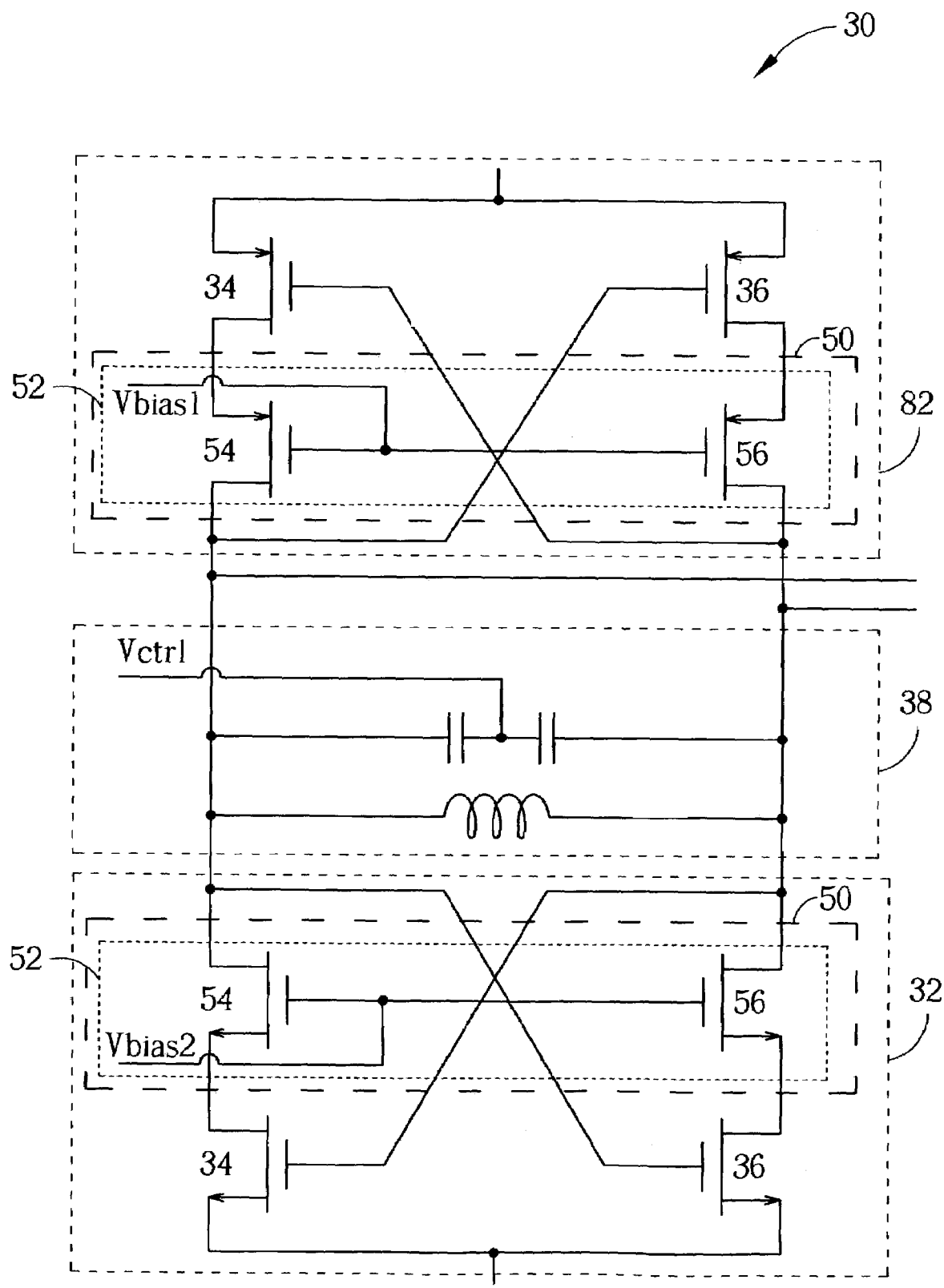
FIGS. 7A and 7B are block diagrams of a LC tank voltage-controlled oscillator using a latch system with another cross-coupling module according to present invention.
Figure 7B:
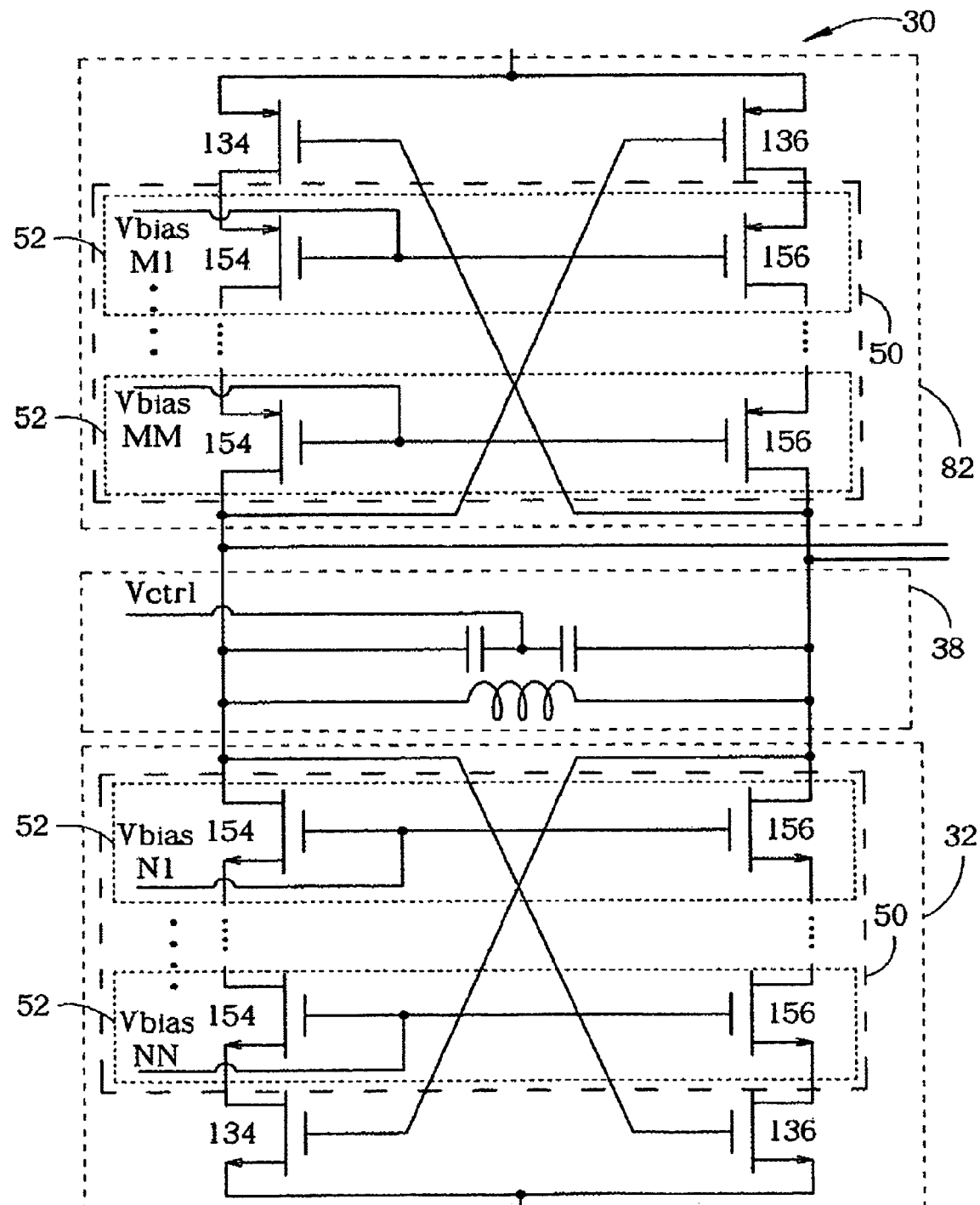

Please refer to FIGS. 7A and 7B. FIGS. 7A and 7B show another embodiment of the latch system 32 according to present invention, wherein the circuit configuration in FIG. 7A is quite similar to the VCO 30 in FIG. 2A and will not again be described in detail. But the latch system 30 in FIG. 7A further comprises a second cross-coupling module 82, wherein the cross-coupling module 82 has an identical circuit configuration to the first cross-coupling module, only it is formed by a plurality of PMOSFETs, such that it will act as the complementary circuitry of the first cross-coupling module in the latch system 32. Besides the connection strategies mentioned above, the current source module of the latch system 32 can also be connected to the sources of the two inverters in the second cross-coupling module 82. The circuit configuration in FIG. 7B is quite similar to the VCO 30 in FIG. 7A and will not again be described in detail. But the first cross-coupling module and the second cross-coupling module 82 of the latch system 32 in FIG. 7B have similar features (i.e. a plurality of action blocks 52) as that in FIGS. 4A and 4B, wherein the gates of the first and the second devices 54, 56 in each action block 52 can also be commonly connected to a reference voltage similar to those in FIG. 2A and FIG. 2B. All of the action blocks 52 can have a single reference voltage value, or they can have different values such as VbiasP1, VbiasP2 . . . VbiasPM and VbiasN1, VbiasN2 . . . VbiasNN as shown in FIGS. 7A and 7B. This is a design choice of the circuit designers.

Figure 8:
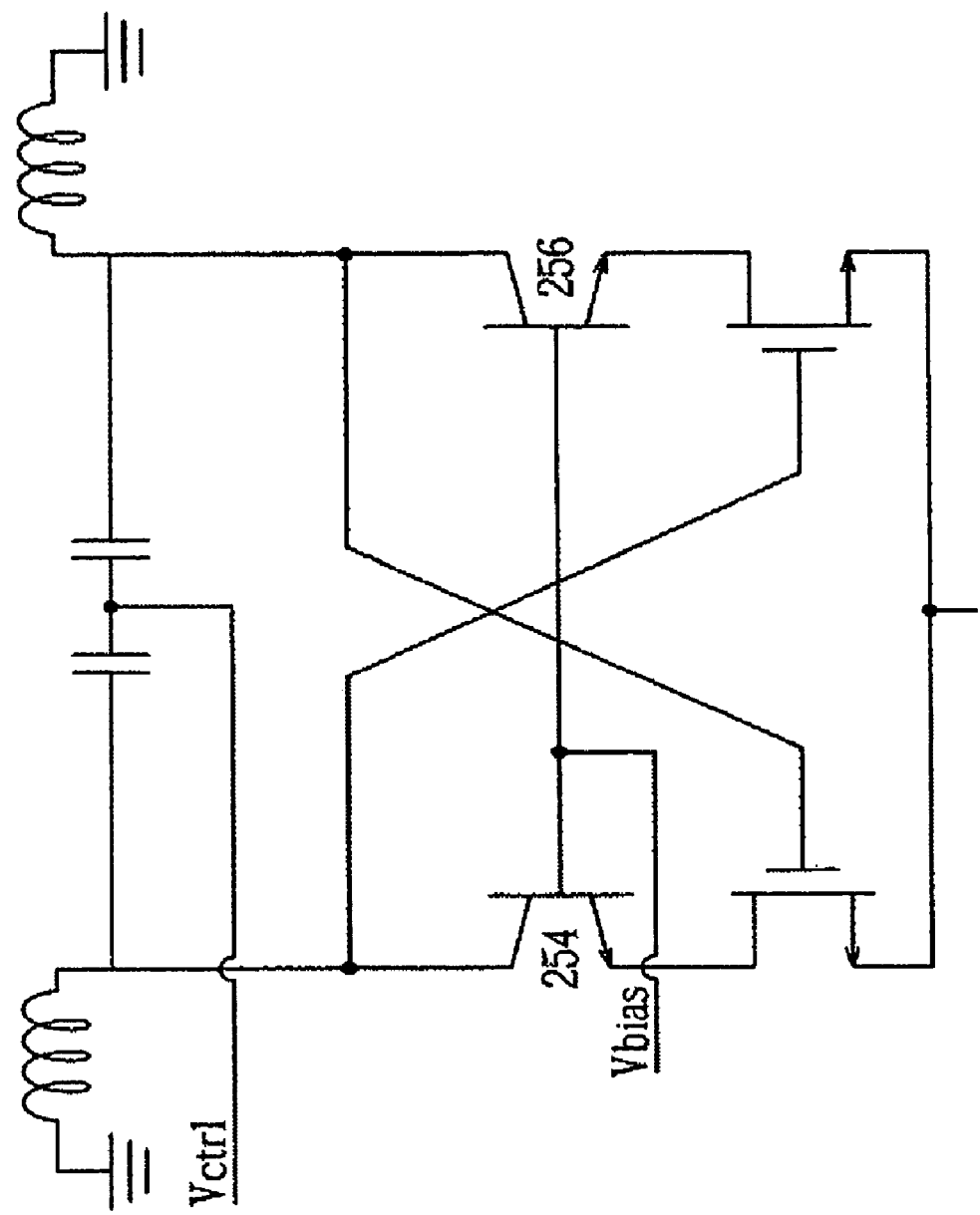
FIG. 8 is a block diagram of a latch system using BJTs as devices in action blocks according to present invention.
Figure 9:
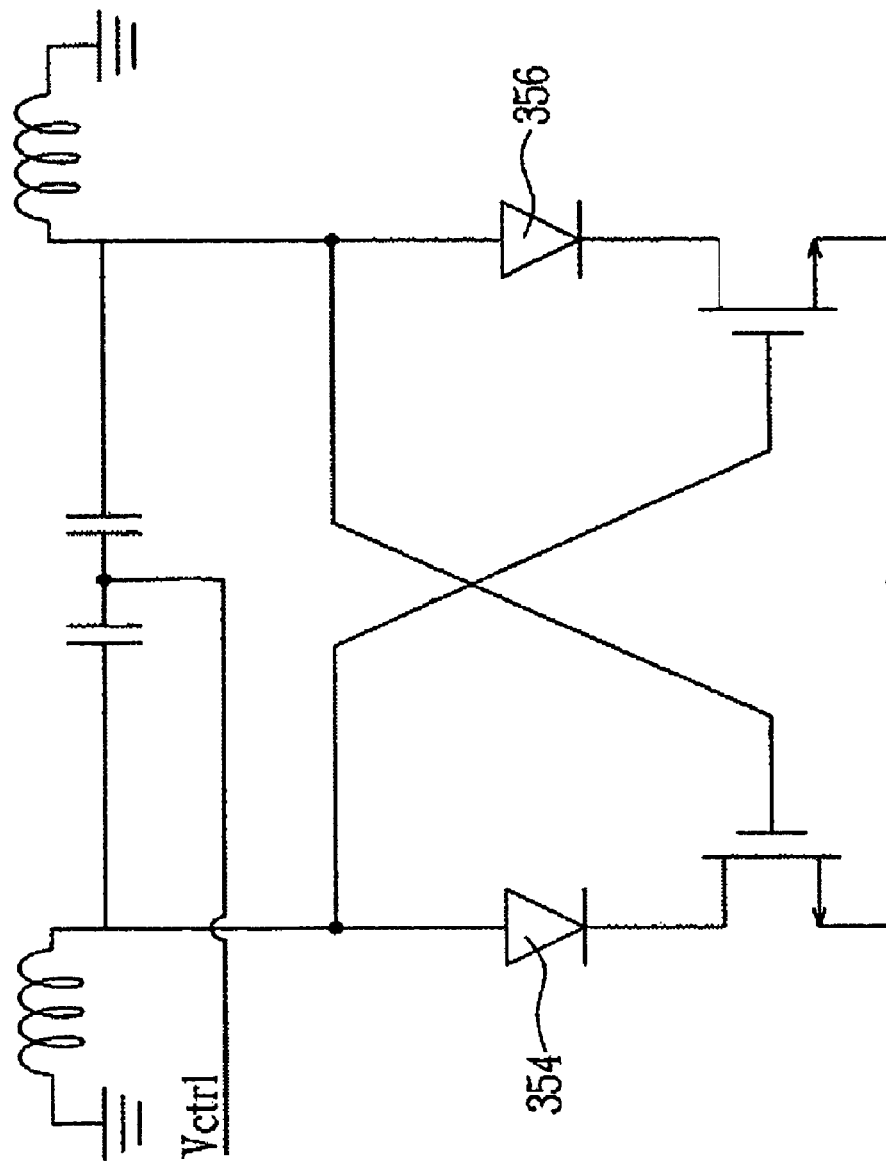
FIG. 9 is a block diagram of a latch system using diodes as devices in action blocks according to present invention.
Figure 10:
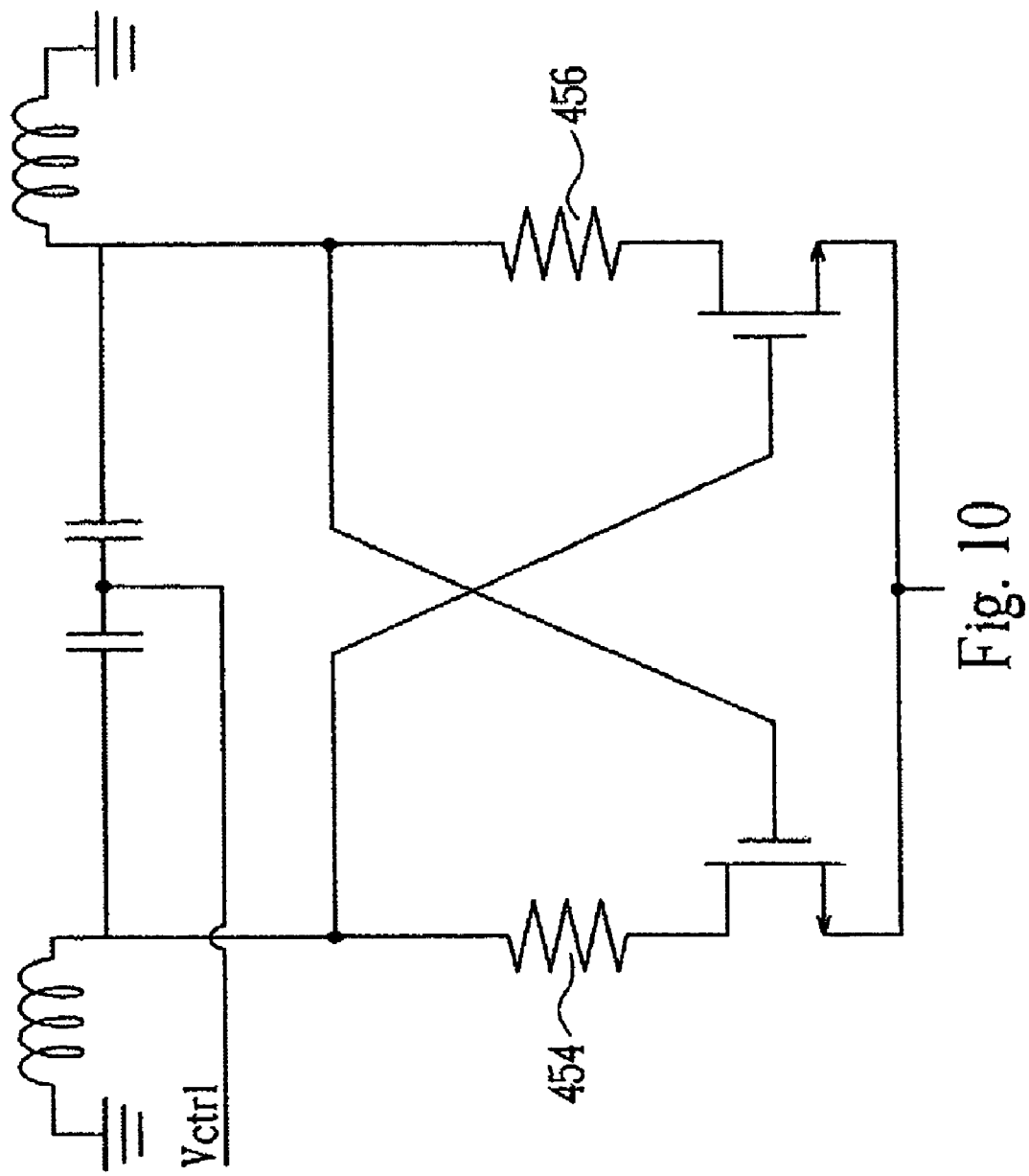
FIG. 10 is a block diagram of a latch system using resistors as devices in action blocks according to present invention.

Now please refer to FIGS. 8, 9, and 10. FIGS. 8, 9, and 10 show other embodiments of the above-mentioned latch system 32 wherein the first and the second devices 54, 56 utilize different device species. Far simplification, in FIGS. 8, 9, and 10 only those applications using NMOSFET technology are shown, while those with PMOSFET technology could be reasoned out easily. FIG. 8 gives a block diagram of the latch system 32 using bipolar junction transistors (BJT) 254, 256 as the first and the second devices 54, 56. FIG. 9 gives a block diagram of the latch system 32 using diodes 354, 356 as the first and the second devices 54, 56. And, FIG. 10 gives a block diagram of the latch system 32 using resistors 454, 456 as the first and the second devices 54, 56.

In contrast to the LC tank VCO according to prior art using a cross-coupled pair to provide negative resistance, the latch system according to present invention comprises an action module to increase its negative resistance, such that a LC tank VCO utilizing the latch system can enter self-resonance more easily.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A latch system comprising:
    a current source module for providing at least one DC current;
    a first cross-coupling module being electrically connected to the current source module, the first cross-coupling module comprising:
        a first transistor having a first node and a second node;
        a second transistor having a third node and a fourth node; and
    an action module directly connected to the first and the second transistors wherein the action module comprises a plurality of action blocks, each of the action blocks comprises a first device and a second device, the first device and the second device of one of the action blocks are gate-coupled, and the action blocks are electrically connected to one another through cascading;
    a plurality of bias terminals, each of the bias terminals being coupled to the gates of the first device and the second device of one of the action blocks for providing an operating bias voltage, and the operating bias voltages provided by the bias terminals having different values; and an LC tank electrically connected to the first node of the first transistor and the third node of the second transistor, the LC tank having at least one capacitor and at least one inductor;

wherein the first node of the first transistor is directly connected to the second device of a first action block, the second node of the first transistor being electrically connected to the first device of a second action block, the third node of the second transistor being directly connected to the first device of the first action block, the fourth node of the second transistor being electrically connected to the second device of the second action block.

2. The latch system of claim 1 wherein each of the bias terminals is directly connected to the gates of the first device and the second device of the corresponding action block.

3. The latch system of claim 1 wherein a drain of the first device of one of the action blocks is directly connected to a source of the first device of another action block.

4. The latch system of claim 1 wherein a drain of the second device of one of the action blocks is directly connected to a source of the second device of another action block.

5. The latch system of claim 1 wherein the first and the second devices of an action block are connected to each other.

6. The latch system of claim 1 wherein the current source module is electrically connected to the first and the second transistors.

7. The latch system of claim 1 wherein the current source module comprises at least one current mirror.

8. The latch system of claim 7 wherein the current source module is electrically connected to one action block of the action module through cascading.

9. A latch system comprising:
a current source module for providing at least one DC current;
a first cross-coupling module being electrically connected to the current source module, the first cross-coupling module comprising:
  a first N-type MOSFET having a gaze and a drain;
  a second N-type MOSFET having a gate and a drain; and
  an action module directly connected to the first and the second N-type MOSFETs wherein the action module comprises a plurality of action blocks, each of the action blocks comprises a third N-type MOSFET and a fourth N-type MOSFET, the third N-type MOSFET and the fourth N-type MOSFET of one of the action blocks are gate-coupled, and the action blocks are electrically connected to one another through cascading;
a plurality of bias terminals, each of the bias terminals being coupled to the gates of the third N-type MOSFET and the fourth N-type MOSFET of one of the action blocks for providing an operating bias voltage, and the operating bias voltages provided by the bias terminals having different values; and
a cross-coupled pair 72 having two P-type MOSFETs;
wherein the gate of the first N-type MOSFET is directly connected to the drain of the fourth N-type MOSFET of a first action block, the drain of the first N-type MOSFET being electrically connected to the source of the third N-type MOSFET of a second action block, the gate of the second N-type MOSFET being directly connected to the drain of the third N-type MOSFET of the first action block, the drain of the second N-type MOSFET being electrically connected to the source of the fourth N-type MOSFET of the second action block, the cross-coupled pair is electrically connected to the gates of the first and the second N-type MOSFETs.

10. The latch system of claim 9 wherein the current source module is electrically connected to the cross-coupled pair.

11. A latch system comprising:
a current source module for providing at least one DC current;
a first cross-coupling module being electrically connected to the current source module, the first cross-coupling module comprising:
  a first P-type MOSFET having a gate and a drain;
  a second P-type MOSFET having a gate and a drain; and
  an action module directly connected to the first and the second P-type MOSFETs wherein the action module comprises a plurality of action blocks, each of the action blocks comprises a third P-type MOSFET and a fourth P-type MOSFET, the third type MOSFET and the fourth P-type MOSFET of one of the action blocks are gate-coupled, and the action blocks are electrically connected to one another through cascading;
a plurality of bias terminals, each of the bias terminals being coupled to the gates of the third P-type MOSFET and the fourth P-type MOSFET of one of the action blocks for providing an operating bias voltage, and the operating bias voltages provided by the bias terminals having different values; and
a cross-coupled pair having two N-type MOSFETs;
wherein the gate of the first P-type MOSFET is directly connected to the drain of the fourth P-type MOSFET of a first action block, the drain of the first P-type MOSFET being electrically connected to the source of the third P-type MOSFET of a second action block, the gate of the second P-type MOSFET being directly connected to the drain of the third P-type MOSFET of the first action block, the drain of the second P-type MOSFET being electrically connected to the source of the fourth P-type MOSFET of the second action block, the cross-coupled pair is electrically connected to the gates of the first and the second P-type MOSFETs.

12. The latch system of claim 11 wherein the current source module is electrically connected to the cross-coupled pair.

* * * * *